United States Patent [19]

Reece

[11] 4,121,303
[45] Oct. 24, 1978

[54] LIGHTSHIELDING HOOD FOR AN ELECTRICAL INSTRUMENT

[76] Inventor: Lawrence L. Reece, 1480 Merrill Rd., San Juan, Calif. 95045

[21] Appl. No.: 842,794

[22] Filed: Oct. 17, 1977

[51] Int. Cl.² .............................................. A42B 1/06
[52] U.S. Cl. ........................................ 2/205; 2/206; 2/10; 353/97; 358/255
[58] Field of Search .................... 2/205, 10, 202, 196, 2/191, 209.1, 206, 84, 85; 358/252, 255; 340/382; 229/93; 353/97; D14/84

[56] References Cited

U.S. PATENT DOCUMENTS

| 2,103,608 | 12/1937 | Blauer | 2/84 |
| 2,376,345 | 5/1945 | Daiber | 2/202 X |
| 2,496,752 | 2/1950 | Rose | 358/255 |
| 2,625,684 | 1/1953 | Magnusson | 2/206 X |
| 3,109,063 | 10/1963 | Parker | 358/252 |
| 3,462,852 | 8/1969 | Emerson | 358/255 X |
| 3,849,598 | 11/1974 | Hoffberger et al. | 353/97 X |
| 3,968,521 | 7/1976 | Bashlow | 2/203 |

Primary Examiner—Peter Nerbun
Attorney, Agent, or Firm—Gerald L. Moore

[57] ABSTRACT

A light shield for use with video display units, such as video monitors, television monitors, oscilloscopes or the like to block out ambient light. The light shield is made of a sleeve or hood having one end adapted to fit over video display units and a second end fitting over the face such that the user can view the display unit through the sleeve and limit the outside ambient light reaching the display unit.

4 Claims, 3 Drawing Figures

LIGHTSHIELDING HOOD FOR AN ELECTRICAL INSTRUMENT

BACKGROUND OF THE INVENTION

Cathode ray tube apparatus of various types and sizes such as video monitors, television monitors, oscilloscopes and the like, are used by engineering, technical and service persons in many different video applications. For instance, an engineer working on a cable television system may have to view a television monitor while on top of a ladder and in bright sunlight. During this viewing he must be able to see very minute details on the video screen. Other types of systems in which installers and repair persons must view video monitors include security systems, antenna systems and the like, wherein the video display must be viewed in the outside bright sunlight.

Such video displays have a limited contrast and if an attempt is made to view them in direct sunlight, the reflected light from the sun shining on the screen will make a reading of the instrument difficult if not impossible. In the past, people using such video units have utilized their coats or similar apparel in an attempt to limit the ambient light shining on the display screen so that the information can be properly read. However the technician frequently does not have such apparel because the technician is usually already overburdened with equipment. In addition such clothing materials if available are unsatisfactory in blanking out bright sunlight.

The effectiveness of such articles in shielding such video display units is lessened because usually such articles are not opaque enough to satisfactorily screen out the ambient light. In addition because of the many different sizes and shapes of video display units, it is difficult to closely surround the unit with the randomly-shaped articles and prevent light leakage. It is the purpose of the present invention to provide a hood which is easily portable and which can be used with many different sizes and shapes of video display units to blank out the ambient light from the sun so that the instrument can be easily observed.

DESCRIPTION OF THE INVENTION

Figure 3:
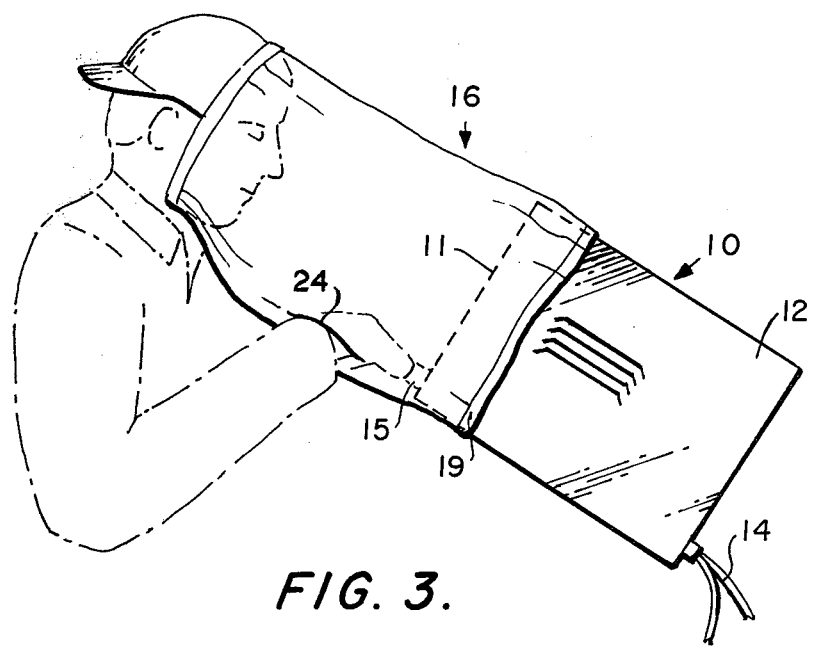
FIG. 3 shows the device of FIG. 1 in position for the user to view the screen and adjust the instrument.

As shown in FIG. 3, frequently there is the need to view the screen of such instruments as the video display unit 10 in a high ambient light situation such as out-of-doors in sunlight. Such instruments are used by technicians in checking cable television circuits, et cetera, and generally comprise a front screen 11 mounted in a cabinet 12 with wires 14 which can be connected to the circuits being tested. The front screen 11 is viewed from the front of the cabinet and the circuits within the device (not shown) can be adjusted by turning certain control knobs 15 usually positioned on or adjacent the front face of the cabinet.

Figure 1:
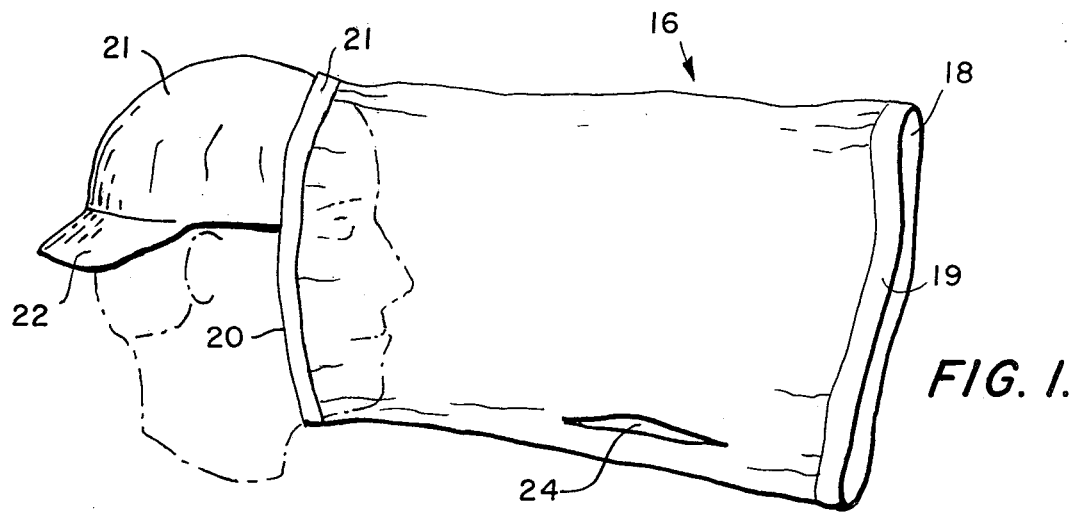
FIG. 1 shows the invention fitted over the face of the user.

In accordance with the invention, a tubular flexible hood or sleeve 16 is provided having a center opening 17 therethrough. At the right or first end in FIG. 1 is a first opening 18 bordered by an elastic band 19. This first opening is of sufficient size to fit over the different sized cabinets 12 of various sized video display units or similar instrument in the manner shown in FIG. 3. The band 13 preferably is made of an elastic material which will stretch sufficiently to fit over the case of video display units and yet contract sufficiently to hold the sleeve in place. At the opposite or second end of the sleeve is a second opening 20 bordered by an elastic band 21. The opening 20 is of sufficient size to fit over the head or face of the user. Once again the band 21 can be elastic to hold the hood in place on the head of the user. The hood is made of cotton, vinyl or similar material having a sufficient density and thickness to prevent the passage of sunlight to the inside of the sleeve. In some instances the sleeve can be made of a double thickness material so less light is transmitted therethrough.

As an added feature, there can be provided an extension 21 on the hood which generally is cap-like in configuration and can include a neck shield 22. The neck shield may be important because linemen, et cetera, who use such instruments, are out in the sun for considerable lengths of time. The addition of this cap-like device further holds the hood in position on the face of the user.

To provide access to the control knobs 15, there is located in the bottom side of the sleeve one or more slits or openings 24 of sufficient size to permit insertion of the hand in the manner shown in FIG. 3. The openings are elongated such that when the hand is removed from the opening, they will close and keep out light.

Figure 2:
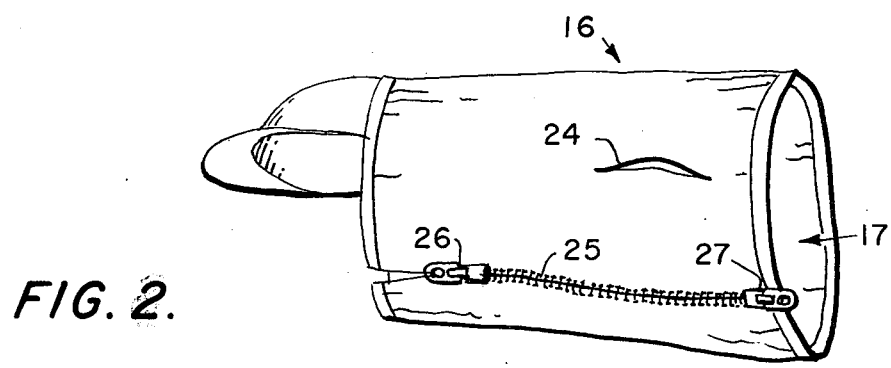
FIG. 2 shows a second embodiment of the invention.

As shown in FIG. 2, another feature of the invention includes the incorporation of a zipper 25 for closing the sleeve which is severed completely down one side. This zipper preferably has a pair of slides 26 and 27 with one being movable in one direction and one being movable in the other direction to completely close the zipper. However, one or both can be moved back from the adjacent hood end for various purposes such as placing the hood over a cabinet which is bigger than the end opening, et cetera.

Thus it can be seen there is provided a convenient shield for shading and keeping out ambient light from a screen or other instrument being observed even though the instrument is used in direct sunlight. By making the hood from a pliable material as previously described, it can be folded up and kept in the pocket or otherwise easily transported until used. Because the hood is flexible, it will fit over most video display units used.

The invention claimed:

1. A hood for viewing a video display unit or like device having a front screen in a cabinet with controls adjacent the screen for adjusting the device, said hood comprising:

a tubular flexible sleeve of a material that is substantially impervious to light having first and second ends and forming a center opening and having a first opening in said first end communicating with said center opening and of a sufficient diameter and flexibility to fit around the cabinet;

means for holding said sleeve around the cabinet;

said sleeve second end forming a second opening communicating with the sleeve center opening and being of sufficient size for fitting over the face of a person using the video display unit; and means for maintaining the sleeve over the person's face whereby the user can adjust the sleeve for viewing the oscilloscope screen through the second opening, the center opening and the first opening in the sleeve.

2. A hood as defined in claim 1 including at least one opening in the sleeve intermediate the first and second ends communicating with the center opening and through which the hand can be inserted for adjusting the controls of the video display unit.

3. A hood as defined in claim 1 wherein said sleeve is cut the entire length thereof from the first opening to the second opening and a zipper is fixed to the edges of said cut for closing the sleeve.

4. A hood for viewing a video display unit or like device having a front screen in a cabinet with controls adjacent the screen for adjusting the device, said hood comprising:

a tubular flexible sleeve having first and second ends and forming a center opening and having a first opening in said first end communicating with said center opening and of a sufficient diameter and flexibility to fit around the cabinet;

means for holding said sleeve around the cabinet;

said sleeve second end forming a second opening communicating with the sleeve center opening and being of sufficient size for fitting over the face of a person using the video display unit;

said sleeve being cut the entire length thereof from the first opening to the second opening and a zipper fixed to the edges of said cut for closing the sleeve;

said zipper including two slide members whereby one slide member can be moved towards the first opening for affixing the hood to the video display unit and the second slide member can be moved towards the second opening for closing the hood over the face of the user; and means for maintaining the sleeve over the person's face whereby the user can adjust the sleeve for viewing the oscilloscope screen through the second opening, the center opening and the first opening in the sleeve.

* * * * *